(12) United States Patent
Iwabuchi

(10) Patent No.: US 12,091,743 B2
(45) Date of Patent: Sep. 17, 2024

(54) SPUTTERING TARGET, MANUFACTURING METHOD THEREFOR, AND MANUFACTURING METHOD FOR MAGNETIC RECORDING MEDIUM

(71) Applicant: JX Nippon Mining & Metals Corporation, Tokyo (JP)

(72) Inventor: Yasuyuki Iwabuchi, Ibaraki (JP)

(73) Assignee: JX Advanced Metals Corporation, Tokyo (JP)

( * ) Notice: Subject to any disclaimer, the term of this patent is extended or adjusted under 35 U.S.C. 154(b) by 1 day.

(21) Appl. No.: 18/016,812

(22) PCT Filed: Jul. 28, 2021

(86) PCT No.: PCT/JP2021/027940
§ 371 (c)(1),
(2) Date: Jan. 18, 2023

(87) PCT Pub. No.: WO2022/049935
PCT Pub. Date: Mar. 10, 2022

(65) Prior Publication Data
US 2023/0272521 A1    Aug. 31, 2023

(30) Foreign Application Priority Data
Sep. 3, 2020   (JP) ................. 2020-148519

(51) Int. Cl.
| | |
|---|---|
| C23C 14/34 | (2006.01) |
| C04B 35/58 | (2006.01) |
| C04B 35/64 | (2006.01) |
| C23C 14/06 | (2006.01) |
| G11B 5/851 | (2006.01) |
| H01J 37/34 | (2006.01) |

(52) U.S. Cl.
CPC .... *C23C 14/3414* (2013.01); *C04B 35/58014* (2013.01); *C04B 35/58021* (2013.01); *C04B 35/64* (2013.01); *C23C 14/0652* (2013.01); *G11B 5/851* (2013.01); *H01J 37/3429* (2013.01); *H01J 37/3491* (2013.01); *C04B 2235/3206* (2013.01); *C04B 2235/3826* (2013.01); *C04B 2235/3856* (2013.01); *C04B 2235/3873* (2013.01); *C04B 2235/3886* (2013.01); *C04B 2235/5436* (2013.01); *C04B 2235/5445* (2013.01); *C04B 2235/656* (2013.01); *H01J 2237/332* (2013.01)

(58) Field of Classification Search
CPC .................. C23C 14/3414; H01J 37/3429
See application file for complete search history.

(56) References Cited

U.S. PATENT DOCUMENTS

| | | |
|---|---|---|
| 2006/0154110 A1 | 7/2006 | Hohlfeld et al. |
| 2010/0177426 A1 | 7/2010 | Kanegae |
| 2013/0084387 A1 | 4/2013 | Hellwig et al. |

FOREIGN PATENT DOCUMENTS

| | | | |
|---|---|---|---|
| JP | 62-95802 A | | 5/1987 |
| JP | 03183765 A | * | 8/1991 |
| JP | 5-116152 A | | 5/1993 |
| JP | 5-213674 A | | 8/1993 |
| JP | 7-180031 A | | 7/1995 |
| JP | 10-291863 A | | 11/1998 |
| JP | 2000-313670 A | | 11/2000 |
| JP | 2006-196151 A | | 7/2006 |
| JP | 2010-165404 A | | 7/2010 |
| JP | 2013-77370 A | | 4/2013 |
| JP | 2018-188714 A | | 11/2018 |

OTHER PUBLICATIONS

Translation to JP 03-183765 published Aug. 1991. (Year: 1999).*
Translation to JP 05-213674 as cited on IDS published Aug. 1993.*
International Preliminary Report on Patentability issued Mar. 7, 2023 in corresponding PCT application No. PCT/JP2021/027940.
International Search Report and Written Opinion mailed Aug. 31, 2021 in corresponding PCT application No. PCT/JP2021/027940.

* cited by examiner

*Primary Examiner* — John J Brayton
(74) *Attorney, Agent, or Firm* — NIELDS, LEMACK & FRAME, LLC

(57) ABSTRACT

A sputtering target containing silicon nitride ($Si_3N_4$) with reduced specific resistance of is provided. A sputtering target including $Si_3N_4$, SiC, MgO and TiCN, wherein a specific resistance of the sputtering target is 10 mΩ·cm or less.

13 Claims, No Drawings

US 12,091,743 B2

SPUTTERING TARGET, MANUFACTURING METHOD THEREFOR, AND MANUFACTURING METHOD FOR MAGNETIC RECORDING MEDIUM

CROSS REFERENCE TO RELATED APPLICATIONS

This application is a U.S. National Phase Application of PCT/JP2021/027940, filed Jul. 28, 2021, which claims the benefit of priority to Japanese Patent Application No. 2020-148519 filed on Sep. 3, 2020 with the Japanese Patent Office, the entire contents of which are incorporated herein by reference in its entirety.

FIELD OF THE INVENTION

The present invention relates to a sputtering target and a method for manufacturing the same. The present invention also relates to a method for manufacturing a magnetic recording medium.

BACKGROUND OF THE INVENTION

Thin films containing silicon nitride ($Si_3N_4$) are used as temperature control layers (or thermally conductive layers), protective layers and sealing layers of magnetic recording media, as well as protective films of thermal print heads, and the like.

In Japanese Patent Application Publication No. 2006-196151 (Patent Literature 1), it is disclosed that low thermal conductivity regions arranged in a pattern corresponding to a bit pattern of a magnetic recording medium typified by an HAMR (heat-assisted magnetic recording) medium comprises oxides selected from $SiO_2$, $ZrO_2$, NiO, $Al_2O_3$, MgO, $Ta_2O_5$, and $TiO_2$; borides selected from $HfB_2$ and $TaB_2$; nitrides selected from ZrN, TiN, AlN, and $Si_3N_4$; carbides selected from ZrC and SiC; and metals selected from Ti and Sc. The literature discloses that the low thermal conductivity regions form part of the temperature control layer and the temperature control layer is adjacent to a magnetic recording layer.

Japanese Patent Application Publication No. 2010-165404 (Patent Literature 2) discloses an invention related to a magnetic recording medium for HDD using a heat-assisted recording method. Specifically, there is disclosed magnetic recording medium, the magnetic recording medium having a substrate and an underlayer thereon, and a recording layer on the underlayer, characterized in that, a thermally conductive layer formed of a thin film made of a plurality of materials having different thermal conductivities is disposed on the recording layer; a first thin film made of a material having the highest thermal conductivity among the plurality of materials is disposed on a part of the track of the recording layer; and a second thin film (low thermal conductivity thin film) made of a material having relatively lower thermal conductivity than the first thin film is disposed between the first thin films in the thermally conductive layer. This literature discloses that the second thin film is made of a material containing silicon nitride. Further, this literature also discloses that the protective film formed on the thermally conductive layer is made of a material containing silicon nitride. Further, this literature also discloses that the low thermal conductivity thin film can be formed by a sputtering method.

Japanese Patent Application Publication No. 2013-077370 (Patent Literature 3) discloses a method for manufacturing a patterned perpendicular magnetic recording medium, the method comprising a step of providing a substrate; a step of depositing on the substrate a recording layer comprising Pt and an element selected from Fe and Co; a step of depositing on the recording layer a sealing layer having substantially no chemical reactivity with the recording layer; a step of annealing the recording layer to form a substantially chemically ordered alloy recording layer having perpendicular magnetic anisotropy; a step of removing the sealing layer after the annealing; and a step of patterning the recording medium into discrete islands. This literature discloses that the sealing layer has the effect of preventing the surface of the FePt layer from becoming rough, that the sealing layer contains silicon nitride, and that the sealing layer is formed by a sputtering method.

In Japanese Patent Application Publication No. 2018-188714 (Patent Literature 4), it is disclosed that, a sputtered film formed using a sputtering target consisting of a sintered body of $Si_3N_4$ (silicon nitride), $SiO_2$ (silicon dioxide) and MgO (magnesium oxide) is chemically stable against heat, has high hardness and excellent abrasion resistance, and can be applied as a protective film for thermal print heads.

PRIOR ART

Patent Literature

[Patent Literature 1] Japanese Patent Application Publication No. 2006-196151
[Patent Literature 2] Japanese Patent Application Publication No. 2010-165404
[Patent Literature 3] Japanese Patent Application Publication No. 2013-077370
[Patent Literature 4] Japanese Patent Application Publication No. 2018-188714

SUMMARY OF THE INVENTION

As one method for forming a thin film containing silicon nitride ($Si_3N_4$), it is conceivable to use a sputtering method. When a sputtering method is used, it is desirable to perform DC sputtering which has high sputtering efficiency and high productivity in order to produce a thin film. However, since silicon nitride has high electrical insulation, there is a problem that it is difficult to adopt the DC magnetron sputtering method.

The present invention has been made in view of the above circumstances, and in one embodiment, one object of the present invention is to reduce the specific resistance of a sputtering target containing silicon nitride ($Si_3N_4$). In another embodiment, an object of the present invention is to provide a method for manufacturing such a sputtering target. In yet another embodiment, an object of the present invention is to provide a method for manufacturing a magnetic recording medium using such a sputtering target.

As a result of intensive studies aimed at solving the above problems, the inventors of the present invention have found that a sputtering target comprising $Si_3N_4$, SiC, MgO and TiCN exhibits a remarkable decrease in specific resistance. The present invention has been completed based on the above findings, and is exemplified below.

[1] A sputtering target, comprising $Si_3N_4$, SiC, MgO and TiCN, wherein a specific resistance of the sputtering target is 10 mΩ·cm or less.
[2] The sputtering target according to [1], wherein assuming $I_{TiCN}$ is an intensity of a diffraction peak representing a crystal phase of TiCN present at an incident angle (2θ) of 41.8° to 42.8° in X-ray diffraction, and $I_{SiN}$ is an intensity of a diffraction peak representing a crystal phase of $Si_3N_4$ present at an incident angle (2θ) of 26.5° to 27.5° in X-ray diffraction, $1.0 \leq I_{TiCN}/I_{SiN}$ is satisfied.

[3] The sputtering target according to [1] or [2], wherein assuming $I_{TiCN}$ is the intensity of the diffraction peak representing the crystal phase of TiCN present at the incident angle (2θ) of 41.8° to 42.8° in X-ray diffraction, and $I_{SiC}$ is an intensity of a diffraction peak representing a crystal phase of SiC present at an incident angle (2θ) of 37.6° to 38.6° in X-ray diffraction, $10.0 \leq I_{TiCN}/I_{SiC}$ is satisfied.

[4] The sputtering target according to [2], wherein assuming $I_{TiCN}$ is the intensity of the diffraction peak representing the crystal phase of TiCN present at the incident angle (2θ) of 41.8° to 42.8° in X-ray diffraction, and $I_{SiC}$ is an intensity of a diffraction peak representing a crystal phase of SiC present at an incident angle (2θ) of 37.6° to 38.6° in X-ray diffraction, $5.0 \leq I_{TiCN}/I_{SiC}$ is satisfied.

[5] The sputtering target according to any of the [1] to [3], wherein the diffraction peak representing the crystal phase of TiCN at the incident angle (2θ) of 41.8° to 42.8° shows the maximum intensity among diffraction peaks present at an incident angle (2θ) of 20° to 80° in X-ray diffraction.

[6] The sputtering target according to any one of [1] to [5], wherein an element concentration of Mg is 0.5 to 2.0% by mass.

[7] The sputtering target according to any one of [1] to [6], wherein a relative density of the sputtering target is 90% or more.

[8] The sputtering target according to any one of [1] to [7], wherein the specific resistance of the sputtering target is 2 mΩ·cm or less.

[9] A method of manufacturing a magnetic recording medium, comprising performing sputtering using the sputtering target according to any one of [1] to 8].

[10] The method of manufacturing a magnetic recording medium according to [9], wherein the sputtering is DC sputtering.

[11] A method of manufacturing a sputtering target, comprising:
a step of mixing $Si_3N_4$ powder, SiC powder, MgO powder, and TiN powder to prepare a mixed powder; and
a step of sintering the mixed powder by a pressure sintering method in a vacuum atmosphere or an inert atmosphere to prepare a sintered body.

[12] The method for manufacturing a sputtering target according to [11], wherein a median diameter (D50) of the mixed powder is 0.5 to 5 μm in a volume-based cumulative particle size distribution measured based on a laser diffraction/scattering method.

[16] The method for manufacturing a sputtering target according to [11] or [12], wherein a holding temperature when sintering the mixed powder is 1700° C. or higher.

[14] The method for manufacturing a sputtering target according to any one of [12] to [13], wherein the mixed powder comprises 10 to 45 mol % of $Si_3N_4$ powder, 10 to 40 mol % of SiC powder, 2 to 6 mol % of MgO powder, and 40 to 70 mol % of TiN powder.

According to one embodiment of the present invention, it is possible to reduce the specific resistance of a sputtering target containing silicon nitride ($Si_3N_4$), preferably to reduce the specific resistance to 10 mΩ·cm or less. Therefore, the sputtering target according to one embodiment of the present invention can also be DC-sputtered.

DETAILED DESCRIPTION OF THE INVENTION

<1. Sputtering Target>

In one embodiment of the present invention, the sputtering target comprises silicon nitride ($Si_3N_4$), silicon carbide (SiC), magnesium oxide (MgO), and titanium carbonitride (TiCN). These compounds play a role in adjusting various properties of the sputtered film, such as conductivity. Among them, TiCN greatly contributes to lowering the specific resistance of the sputtering target itself containing $Si_3N_4$. Since Ti, C and N have been used as elements constituting non-magnetic layers of magnetic recording media, it is presumed that they do not cause unexpected side effects. Although the present invention is not intended to be limited by theory, the reason why the specific resistance of the sputtering target is lowered by containing TiCN is presumed as follows. Since TiCN is a conductive material, its presence in the target is considered to form conductive paths and lower the specific resistance.

In one embodiment of the present invention, the sputtering target may have a specific resistance of 10 mΩ·cm or less, preferably 5 mΩ·cm or less, more preferably 2 mΩ·cm or less, even more preferably 1 mΩ·cm or less, even more preferably 0.5 mΩ cm or less, and for example, it may have a specific resistance of 0.1 to 10 mΩ·cm. In this specification, the specific resistance of the sputtering target is the value obtained by measuring the sputtering surface of the sputtering target with the four-probe method based on JIS K7194: 1994 (when the electrical resistance is $1.0 \times 10^6 \Omega$ or less) or with the double ring electrode method based on JIS K6271-1: 2015 (when the electrical resistance exceeds $1.0 \times 10^6 \Omega$).

In one embodiment of the sputtering target according to the present invention, assuming $I_{TiCN}$ is an intensity of a diffraction peak representing a crystal phase of TiCN present at an incident angle (2θ) of 41.8° to 42.8° in X-ray diffraction, and $I_{SiN}$ is an intensity of a diffraction peak representing a crystal phase of $Si_3N_4$ present at an incident angle (2θ) of 26.5° to 27.5° in X-ray diffraction, $1.0 \leq I_{TiCN}/I_{SiN}$ is satisfied. A larger $I_{TiCN}/I_{SiN}$ is advantageous for lowering the specific resistance of the sputtering target, so it is preferable that $1.5 \leq I_{TiCN}/I_{SiN}$ be satisfied, more preferable that $2.0 \leq I_{TiCN}/I_{SiN}$ be satisfied, and even more preferable that $2.5 \leq I_{TiCN}/I_{SiN}$ be satisfied. There is no particular upper limit for $I_{TiCN}/I_{SiN}$, but if it is too high, the proportion of $Si_3N_4$ will decrease excessively, so it is preferable that $I_{TiCN}/I_{SiN} \leq 10$ be satisfied, more preferable that $I_{TiCN}/I_{SiN} \leq 7$ be satisfied, and even more preferable that $I_{TiCN}/I_{SiN} \leq 5$ be satisfied.

In one embodiment of the sputtering target according to the present invention, assuming $I_{TiCN}$ is an intensity of a diffraction peak representing a crystal phase of TiCN present at an incident angle (2θ) of 41.8° to 42.8° in X-ray diffraction, and $I_{SiC}$ is an intensity of a diffraction peak representing a crystal phase of SiC present at an incident angle (2θ) of 37.6° to 38.6° in X-ray diffraction, $5.0 \leq I_{TiCN}/I_{SiC}$ is satisfied. A larger $I_{TiCN} I_{SiC}$ is advantageous for lowering the specific resistance of the sputtering target, so it is preferable that $10.0 \leq I_{TiCN}/I_{SiC}$ be satisfied, more preferable that $15.0 \leq I_{TiCN}/I_{SiC}$ be satisfied, and even more preferable that $20.0 \leq I_{TiCN}/I_{SiC}$ be satisfied. There is no particular upper limit for $I_{TiCN}/I_{SiC}$, but if it is too high, the proportion of SiC will decrease excessively, so it is preferable that $I_{TiCN}/I_{SiC} \leq 50$ be satisfied, more preferable that $I_{TiCN}/I_{SiC} \leq 40$ be satisfied, and even more preferable that $I_{TiCN}/I_{SiC} \leq 30$ be satisfied.

In a preferred embodiment of the present invention, the sputtering target satisfies both the preferred ranges defined above for $I_{TiCN}/I_{SiN}$ and the preferred ranges defined above for $I_{TiCN}/I_{SiC}$.

In one embodiment of the sputtering target according to the present invention, a diffraction peak representing a crystal phase of TiCN at an incident angle (2θ) of 41.8° to 42.8° shows the maximum intensity among diffraction peaks present at an incident angle (2θ) of 20° to 80° in X-ray diffraction.

The measurement method for analyzing the sputtering target using an X-ray diffraction device can be performed in accordance with JIS K0131:1996, and the measurement conditions can be as follows.

Location for sputtering target analysis: a cut plane perpendicular to the sputtering surface
X-ray source: Cu-Kα
Tube voltage: 40 kV
Tube current: 30 mA
Goniometer: sample horizontal type
Scan speed: 10°/min
Scan step: 0.01°
Measurement range: 2θ=20° to 80°
Background removal: fitting method (method of performing a simple peak search, removing the peak part, and then fitting a polynomial to the remaining data)

In addition, the analysis portion is polished using a polishing agent finer than #2000 at least, and a flat surface with less unevenness is measured.

In a sputtering target according to an embodiment of the present invention, an element concentration of Mg is 0.5 to 2.0% by mass. The element concentration of Mg can be analyzed by ICP optical emission spectrometry. Mg can be present in the form of MgO. In the sputtering target according to one embodiment of the present invention, substantially all Mg exists in the form of MgO.

In the sputtering target according to one embodiment of the present invention, the total element concentration of Si, N, C, Mg, O, and Ti is 90% by mass or more, and may be 95% by mass or more, or may be 99% by mass or more. Moreover, the sputtering target according to one embodiment of the present invention can also consist of Si, N, C, Mg, O, and Ti except for inevitable impurities.

Since $Si_3N_4$ and SiC are difficult to sinter, the relative density of the sintered body obtained by sintering them tends to be low. However, in one embodiment, the sputtering target according to the present invention has a relative density of 90% or more, preferably 92% or more, more preferably 94% or more, and for example, 90 to 96%. Increasing the relative density contributes to reducing the number of particles generated during sputtering. The relative density is determined by the ratio of the measured density to the theoretical density determined by the composition. The measured density is measured based on the geometric measurement of JIS Z8807:2012, and the theoretical density determined by the composition cannot take into account the density of the compounds that actually exist, so the relative density may exceed 100%. The theoretical density is the density when it is assumed that the raw materials of the sputtering target member exist as a mixture without diffusing or reacting with each other, and it is expressed by theoretical density (g/cc)=Σ (molecular weight of raw material composition×molar ratio of raw material composition)/Σ (molecular weight of raw material composition×molar ratio of raw material composition/literature value for density of raw material composition), based on the raw material composition. Also, inevitable impurities shall not be included in the calculation of relative density.

<2. Method for Manufacturing Sputtering Target>

A sputtering target according to an embodiment of the present invention can be manufactured, for example, using a powder sintering method, and specific examples thereof are as follows.

$Si_3N_4$ powder, SiC powder, MgO powder, and TiN powder are prepared as raw material powders. It is believed that TiN deprives SiC of carbon by sintering under appropriate sintering conditions to form TiCN. In addition, by using TiN as a raw material, the sinterability of $Si_3N_4$ and SiC, which are materials difficult to sinter, is improved, and the relative density can be increased. In addition, TiN has a high melting point of 2930° C. and does not melt during sintering, so it has the advantage of preventing coarsening of crystal grains. Although it is possible to use TiCN as a raw material, TiN is generally more readily available and contributes to reduction in material costs.

The raw material powder preferably has a median diameter in the range of 0.5 to 5 μm. As a result, the composition of the sputtering target obtained after sintering becomes uniform, and the quality of the sputtered film is easily stabilized. When the median diameter of the raw material powder is 5 μm or less, preferably 3 μm or less, coarse particles are less likely to generate in the sputtering target. On the other hand, when the median diameter of the raw material powder is 0.5 μm or more, preferably 1 μm or more, it is possible to suppress the occurrence of agglomeration among particles constituting the raw material powder.

Next, the plurality of raw material powders is weighed so as to have a desired composition, mixed and pulverized using a known technique. Thereby, a mixed powder in which the plurality of raw material powders is uniformly mixed can be obtained. The mixing is preferably carried out by a dry method using a ball mill or the like. This is because MgO can be prevented from changing to Mg(OH). The median diameter of the mixed powder is preferably 0.5 to 5 μm, more preferably 0.7 to 3 μm.

The composition of the mixed powder must be appropriately selected because it affects the diffraction peak intensity of the compound in the sputtering target (for example, $I_{TiCN}/I_{SiN}$, $I_{TiCN}/I_{SiC}$). In one embodiment, the mixed powder comprises 10 to 45 mol % of $Si_3N_4$ powder, 10 to 40 mol % of SiC powder, 2 to 6 mol % of MgO powder, and 40 to 70 mol % of TiN powder. In a preferred embodiment, the mixed powder comprises 15 to 40 mol % $Si_3N_4$ powder, 12.5 to 37.5 mol % SiC powder, 2.3 to 5.7 mol % MgO powder, and 45 to 65 mol % TiN powder. In a more preferred embodiment, the mixed powder comprises 20 to 35 mol % of $Si_3N_4$ powder, 15 to 35 mol % of SiC powder, 2.6 to 5.4 mol % of MgO powder, and 47 to 60 mol % of TiN powder. Other components may or may not be added to the mixed powder as appropriate. In one embodiment, the mixed powder consists of $Si_3N_4$, SiC, MgO, TiN, and inevitable impurities.

In addition, the median diameter of the raw material powder and mixed powder can be adjusted by pulverization or sieving. The median diameter of each powder described above means a particle diameter at an integrated value of 50% (D50) in a volume-based cumulative particle size distribution measured based on a laser diffraction/scattering method.

After that, the obtained mixed powder is pressurized and sintered in a vacuum atmosphere or an inert atmosphere such as Ar, and formed into a predetermined shape such as a disk shape. As the sintering method, various pressure sintering methods such as hot press sintering, hot isostatic pressing sintering, and plasma discharge sintering can be used. Among them, the hot isostatic pressing sintering method is effective from the viewpoint of improving the density of the sintered body.

The holding temperature during sintering is preferably 1700° C. or higher, more preferably 1750° C. or higher, and a temperature range of 1750° C. to 1755° C. is particularly preferred, in order to obtain a sufficient density and secure the conductive paths by TiCN. The holding time at the holding temperature is preferably two hours or longer. The holding time is preferably 4 hours or less, more preferably 3 hours or less, in order to prevent crystal grains from coarsening and prevent loss of uniform resistivity in the sintered body. As to the applied pressure during sintering, higher pressure is advantageous for improving the density, but if it is too high, there is a risk of cracking, so it is preferably from 250 kgf/cm$^2$ to 350 kgf/cm$^2$, more preferably from 280 kgf/cm$^2$ to 320 kgf/cm$^2$.

A sputtering target according to an embodiment of the present invention can be prepared by forming the obtained sintered body into a desired shape using a lathe or the like. The shape of the target is not particularly limited, but examples thereof include a flat plate shape (including a disk shape and a rectangular plate shape) and a cylindrical shape. A sputtering target according to an embodiment of the invention can also be bonded to a backing plate to construct a sputtering target assembly.

<3. Use>

A sputtered film can be obtained by forming a film on a predetermined substrate or other films by sputtering the sputtering target according to one embodiment of the present invention, ordinary in a magnetron sputtering apparatus. Since the sputtering target according to one embodiment of the present invention has a low specific resistance, DC sputtering using a direct current is possible.

A sputtering target according to an embodiment of the invention can be used, for example, to form a non-magnetic layer of a magnetic recording medium, in particular, a HAMR medium, and a protective film of a thermal print head. As the non-magnetic layer of a magnetic recording medium, a temperature control layer (or thermally conductive layer), a protective layer, and a sealing layer, which are laminated adjacent to a magnetic recording layer, as described in the prior art literatures mentioned above can be mentioned. Therefore, according to one embodiment of the present invention, there is provided a method for manufacturing a magnetic recording medium, comprising sputtering using the sputtering target according to one embodiment of the present invention described above.

In one embodiment, the magnetic recording medium comprises an underlayer, a temperature control layer, a magnetic recording layer, and a protective layer in this order on a substrate such as aluminum or glass.

In one embodiment, a magnetic recording medium comprises an underlayer, a magnetic recording layer, a thermally conductive layer, and a protective layer in this order on a substrate such as aluminum or glass.

EXAMPLES

Examples of the present invention are presented below along with Comparative Examples. These examples are provided for a better understanding of the present invention and its advantages, and are not intended to limit the present invention.

Examples 1 to 2, Comparative Examples 1 to 6

(1. Preparation of Sputtering Target)

As raw material powders, Si$_3$N$_4$ powder (median diameter: 0.5 μm), SiC powder (median diameter: 3 μm), MgO powder (median diameter: 1 μm), and TiN powder (median diameter: 1.5 μm) were prepared. The median diameter of these raw material powders was measured by a wet method using a particle size distribution analysis device Model LA-920 available from by Horiba, Ltd., by dispersing the powders in an ethanol solvent. In the case of a single powder, the refractive index used was the value that matches the component, and in the case of a mixed powder, the value of the component having the largest volume fraction was used.

Using the above raw material powders, the raw material powders were weighed so as to have the molar ratios shown in Table 2 according to the test number, and the powders were sealed in a ball mill pot with a capacity of 10 liters together with zirconia balls as grinding media, and mixed by rotating under Ar atmosphere for 8 hours. When the median diameter of the obtained mixed powders was measured by the wet method described above, each of them was 0.8 to 1.2 μm.

The mixed powder taken out from the ball mill pot was filled in a carbon mold with a diameter of 180 mm and sintered by hot pressing. The conditions of the hot pressing were a holding temperature of 1750° C., a vacuum atmosphere, a heating rate of 300° C./hour, and a holding time of 2 hours. After the end of the holding, it was allowed to cool naturally in the chamber. The sintered body after the hot pressing was ground using a general-purpose lathe and a surface grinder, and cut with a lathe so as to have a disk shape with a diameter of 165.1 mm and a thickness of 5 mm to prepare the sputtering targets of Example 1 to 2 and Comparative Examples 1 to 6.

(2. Xrd Analysis)

For each sputtering target prepared under the above manufacturing conditions, a cut surface perpendicular to a sputtering surface was mirror-polished. XRD analysis was performed on the resulting polished surface using an X-ray diffractometer (Ultima IV available from Rigaku Corporation) under the measurement conditions described above. For background removal, the "background removal by fitting" of integrated powder X-ray analysis software PDXL2 available from Rigaku Corporation was adopted. In this manner, the intensity of the diffraction peak representing the crystalline phase of TiCN ($I_{TiCN}$) present at an incident angle (2θ) of 41.8° to 42.8°, the intensity of the diffraction peak representing the crystal phase of Si$_3$N$_4$ ($I_{SiN}$) present at an incident angle (2θ) of 26.5° to 27.5°, and the intensity of the diffraction peak representing the crystal phase of SiC ($I_{SiC}$) present at an incident angle (2θ) of 37.6° to 38.6° were measured. Further, among the diffraction peaks present at an incident angle (2θ) of 20° to 80°, the position of the peak exhibiting the maximum intensity was identified, and the compound exhibiting the peak was identified. The results are shown in Table 3.

(3. Element Concentration of Mg)

For each sputtering target prepared under the above manufacturing conditions, the element concentration of Mg was measured by ICP optical emission spectrometry using model SPS5520 manufactured by Hitachi High-Tech Corporation. In addition, since the Mg in the target originates from the MgO powder in the raw material, it is considered that substantially all of the Mg exists in the form of MgO. The results are shown in Table 4.

(4. Relative Density)

The relative density of each sputtering target prepared under the above manufacturing conditions was measured by the method described above. For example, the relative density of Example 1 was determined by the above-described calculation formula using the molecular weights and literature values for density of $Si_3N_4$, TiN, SiC and MgO as the values in Table 1. The results are shown in Table 4.

(5. Specific Resistance)

For each sputtering target prepared under the above manufacturing conditions, the specific resistance of the sputtering surface was measured with the four-probe method based on JIS K7194: 1994 (when the electrical resistance is $1.0 \times 10^6 \Omega$ or less) using a resistance measuring device model FEEL-TC-100-SB manufactured by NPS Inc., or with the double ring electrode method based on JIS K6271-1: 2015 (when the electrical resistance exceeds $1.0 \times 10^6 \Omega$) using a "Hiresta" model UX MCP-HT800 manufactured by Nittoseiko Analytech Co., Ltd. The results are shown in Table 4.

(6. Availability of DC Sputtering)

Each sputtering target prepared under the above manufacturing conditions was bonded to a backing plate made of Cu having a diameter of 180 mm, attached to a DC sputtering apparatus (model C-3010 manufactured by CANON ANELVA CORPORATION), and subjected to sputtering. The sputtering conditions were a sputtering power of 1 kW and an Ar gas pressure of 1.7 Pa. When it was possible to discharge, it was evaluated as "Available", and when it was not possible to discharge, it was evaluated as "Not available". The results are shown in Table 4.

From the above test results, it was found that the specific resistance significantly decreased when the sputtering target contained TiCN in addition to $Si_3N_4$, SiC and MgO. It was also found that the higher $I_{TiCN}/I_{SiN}$ and $I_{TiCN}/I_{SiC}$ are more effective in lowering the specific resistance and DC sputtering becomes possible.

TABLE 1

| Compositional components | $Si_3N_4$ | TiN | SiC | MgO |
|---|---|---|---|---|
| Molecular weight of compositional components (g/mol) | 140.28 | 61.89 | 40.10 | 40.30 |
| Literature value for density of compositional components (g/cc) | 3.200 | 5.430 | 3.218 | 3.584 |

TABLE 2

| | Raw material mixed powder composition mol % | | | |
|---|---|---|---|---|
| | $Si_3N_4$ | TiN | SiC | MgO |
| Comparative Example 1 | 66.0 | 0.0 | 29.3 | 4.7 |
| Comparative Example 2 | 34.4 | 0.0 | 62.3 | 3.3 |
| Comparative Example 3 | 22.7 | 0.0 | 74.4 | 2.9 |
| Comparative Example 4 | 6.4 | 0.0 | 91.5 | 2.2 |
| Comparative Example 5 | 49.3 | 22.1 | 24.7 | 3.9 |
| Comparative Example 6 | 37.0 | 38.3 | 21.3 | 3.4 |
| Example 1 | 28.0 | 50.0 | 19.0 | 3.0 |
| Example 2 | 20.3 | 60.2 | 16.8 | 2.7 |
| Example 3 | 25.1 | 48.6 | 23.3 | 3.0 |
| Example 4 | 22.9 | 47.3 | 26.9 | 2.9 |

TABLE 3

| | $I_{TiCN}$ | | $I_{SiN}$ | | $I_{SiC}$ | | | | Maximum |
|---|---|---|---|---|---|---|---|---|---|
| | Peak position (2θ)° | Peak intensity | Peak position (2θ)° | Peak intensity | Peak position (2θ)° | Peak intensity | $I_{TiCN}/I_{SiN}$ | $I_{TiCN}/I_{SiC}$ | peak position and compound (2θ)° |
| Comparative Example 1 | | | 27.01 | 958919 | 38.11 | 76537 | 0.0 | 0.0 | 27.01(SiN) |
| Comparative Example 2 | | | 27.30 | 115766 | 38.34 | 37283 | 0.0 | 0.0 | 27.3(SiN) |
| Comparative Example 3 | | | 27.22 | 90141 | 38.26 | 56116 | 0.0 | 0.0 | 35.52(SiC) |
| Comparative Example 4 | | | 27.04 | 3816 | 38.26 | 90950 | 0.0 | 0.0 | 35.61(SiC) |
| Comparative Example 5 | 42.31 | 228236 | 27.06 | 602426 | 37.91 | 68952 | 0.4 | 3.3 | 27.06(SiN) |
| Comparative Example 6 | 42.34 | 357180 | 27.06 | 387520 | 38.11 | 38612 | 0.9 | 9.3 | 27.06(SiN) |
| Exemple 1 | 42.34 | 427973 | 27.01 | 256047 | 36.16 | 28499 | 1.7 | 15.0 | 42.34(TiCN) |
| Example 2 | 42.34 | 516796 | 27.01 | 176902 | 38.13 | 19375 | 2.9 | 26.7 | 42.34(TiCN) |
| Example 3 | 42.34 | 417050 | 27.03 | 207468 | 36.14 | 54769 | 2.0 | 7.6 | 42.34(TiCN) |
| Example 4 | 42.34 | 410525 | 27.03 | 172043 | 38.14 | 80352 | 2.4 | 5.1 | 42.34(TiCN) |

Examples 3 and 4

Sputtering targets according to Examples 3 and 4 obtained based on the above knowledge will be described. The sputtering targets of Examples 3 and 4 could be manufactured by the same manufacturing procedure as in Example 1, except that the raw material mixed powder composition shown in Table 2 is used. XRD analysis, Mg concentration, relative density, specific resistance and availability of DC sputtering of the sputtering targets of Examples 3 and 4 were estimated, and are shown in Tables 3 and 4.

TABLE 4

| | Mg concentration in target (mass %) | Relative density % | Specific resistance mΩ · cm | DC sputtering |
|---|---|---|---|---|
| Comparative Example 1 | 1.02 | 93 | $6 \times 10^{15}$ | Not available |
| Comparative Example 2 | 1.10 | 92 | $2 \times 10^5$ | Not available |
| Comparative Example 3 | 1.14 | 90 | $1 \times 10^5$ | Not available |
| Comparative Example 4 | 1.17 | 70 | $6 \times 10^5$ | Not available |

TABLE 4-continued

| | Mg concentration in target (mass %) | Relative density % | Specific resistance mΩ · cm | DC sputtering |
|---|---|---|---|---|
| Comparative Example 5 | 0.98 | 94 | $2 \times 10^{13}$ | Not available |
| Comparative Example 6 | 0.94 | 94 | $8 \times 10^{9}$ | Not available |
| Example 1 | 0.91 | 95 | 0.9 | Available |
| Example 2 | 0.87 | 95 | 0.3 | Available |
| Example 3 | 0.96 | 94 | 1.5 | Available |
| Example 4 | 0.96 | 93 | 1.1 | Available |

The invention claimed is:

1. A sputtering target, comprising $Si_3N_4$, SiC, MgO and TiCN, wherein a specific resistance of the sputtering target is 10 mΩ·cm or less and a diffraction peak representing the crystal phase of TiCN at the incident angle (2θ) of 41.8° to 42.8° shows the maximum intensity among diffraction peaks present at an incident angle (2θ) of 20° to 80° in X-ray diffraction.

2. The sputtering target according to claim 1, wherein assuming $I_{TiCN}$ is an intensity of the diffraction peak representing the crystal phase of TiCN present at the incident angle (2θ) of 41.8° to 42.8° in X-ray diffraction, and $I_{SiN}$ is an intensity of a diffraction peak representing a crystal phase of $Si_3N_4$ present at an incident angle (2θ) of 26.5° to 27.5° in X-ray diffraction, $1.0 \leq I_{TiCN}/I_{SiN}$ is satisfied.

3. The sputtering target according to claim 1, wherein assuming $I_{TiCN}$ is an intensity of the diffraction peak representing the crystal phase of TiCN present at the incident angle (2θ) of 41.8° to 42.8° in X-ray diffraction, and $I_{SiC}$ is an intensity of a diffraction peak representing a crystal phase of SiC present at an incident angle (2θ) of 37.6° to 38.6° in X-ray diffraction, $10.0 \leq I_{TiCN}/I_{SiC}$ is satisfied.

4. The sputtering target according to claim 2, wherein assuming $I_{TiCN}$ is the intensity of the diffraction peak representing the crystal phase of TiCN present at the incident angle (2θ) of 41.8° to 42.8° in X-ray diffraction, and $I_{SiC}$ is an intensity of a diffraction peak representing a crystal phase of SiC present at an incident angle (2θ) of 37.6° to 38.6° in X-ray diffraction, $5.0 \leq I_{TiCN}/I_{SiC}$ is satisfied.

5. The sputtering target according to claim 1, wherein an element concentration of Mg is 0.5 to 2.0% by mass.

6. The sputtering target according to claim 1, wherein a relative density of the sputtering target is 90% or more.

7. The sputtering target according to claim 1, wherein the specific resistance of the sputtering target is 2 mΩ·cm or less.

8. A method of manufacturing a magnetic recording medium, comprising performing sputtering using the sputtering target according to claim 1.

9. The method of manufacturing a magnetic recording medium according to claim 8, wherein the sputtering is DC sputtering.

10. A method of manufacturing the sputtering target according to claim 1, comprising:
 a step of mixing $Si_3N_4$ powder, SiC powder, MgO powder, and TiN powder to prepare a mixed powder; and
 a step of sintering the mixed powder by a pressure sintering method in a vacuum atmosphere or an inert atmosphere to prepare a sintered body.

11. The method for manufacturing a sputtering target according to claim 10, wherein a median diameter (D50) of the mixed powder is 0.5 to 5 μm in a volume-based cumulative particle size distribution measured based on a laser diffraction/scattering method.

12. The method for manufacturing a sputtering target according to claim 10, wherein a holding temperature when sintering the mixed powder is 1700° C. or higher.

13. The method for manufacturing a sputtering target according to claim 10, wherein the mixed powder comprises 10 to 45 mol % of $Si_3N_4$ powder, 10 to 40 mol % of SiC powder, 2 to 6 mol % of MgO powder, and 40 to 70 mol % of TiN powder.

* * * * *